United States Patent

Lien

[11] Patent Number: 6,001,717
[45] Date of Patent: Dec. 14, 1999

[54] METHOD OF MAKING LOCAL INTERCONNECTIONS FOR DYNAMIC RANDOM ACCESS MEMORY (DRAM) CIRCUITS WITH REDUCED CONTACT RESISTANCE AND REDUCED MASK SET

[75] Inventor: Wan-Yih Lien, Hsinchu, Taiwan

[73] Assignee: Vanguard International Semiconductor Corporation, Hsin-Chu, Taiwan

[21] Appl. No.: 09/249,258

[22] Filed: Feb. 12, 1999

[51] Int. Cl.$^6$ .................. H01L 21/28; H01L 21/336
[52] U.S. Cl. .................. 438/586; 438/592; 438/655; 438/663
[58] Field of Search .................. 438/586, 592, 438/618, 620, 621, 630, 649, 651, 655, 663, 664, 683

[56] References Cited

U.S. PATENT DOCUMENTS

| | | | |
|---|---|---|---|
| 5,194,404 | 3/1993 | Nagatomo | 438/655 |
| 5,510,296 | 4/1996 | Yen et al. | 438/649 |
| 5,710,078 | 1/1998 | Tseng | 438/620 |
| 5,710,454 | 1/1998 | Wu | 257/413 |
| 5,728,615 | 3/1998 | Cheng et al. | 438/238 |
| 5,744,395 | 4/1998 | Shue et al. | 438/305 |
| 5,759,882 | 6/1998 | Kao et al. | 438/202 |
| 5,795,827 | 8/1998 | Liaw et al. | 438/663 |
| 5,899,735 | 5/1999 | Tseng | 438/592 |
| 5,926,728 | 7/1999 | Lee et al. | 438/586 |

*Primary Examiner*—T. N. Quach
*Attorney, Agent, or Firm*—George O. Saile; Stephen B. Ackerman

[57] ABSTRACT

A method for making low-resistance contacts between polycide layers for local interconnections is achieved. The method is particularly useful for making low contact resistance $R_c$ between the tungsten polycide layers for local interconnections on the periphery of the DRAM chip. A first polycide layer is patterned to form FET gate electrodes and portions of local interconnections. An interlevel dielectric layer is deposited over the patterned first polycide layer. Contact openings are etched in the dielectric layer to the surface of the substrate and to the first polycide layer. A second polycide layer is deposited and patterned to form bit lines in the memory cell areas of the DRAM, while concurrently forming local interconnections in the peripheral device areas. A high-temperature rapid thermal anneal (RTA) is carried out to substantially reduce the contact resistance in the contact openings over the first polycide layer in the peripheral areas. This RTA eliminates the need for overetching the first silicide in the contact holes, as commonly practiced in the prior art. The RTA of this invention with a traditional $N_2$ anneal prior to the second polycide deposition results in a synergistic effect that further reduces the contact resistance $R_c$.

21 Claims, 2 Drawing Sheets

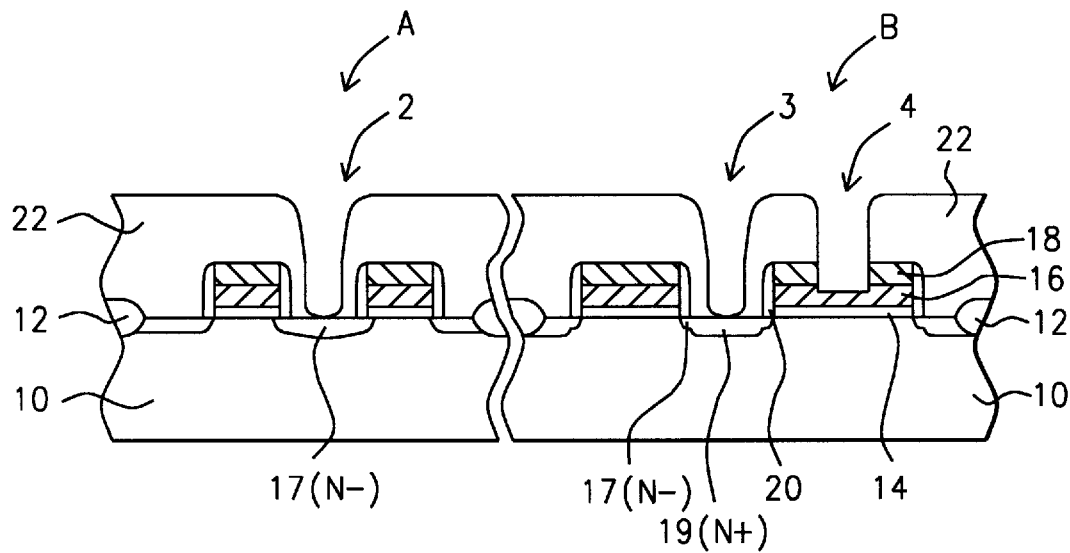
FIG. 1 – Prior Art
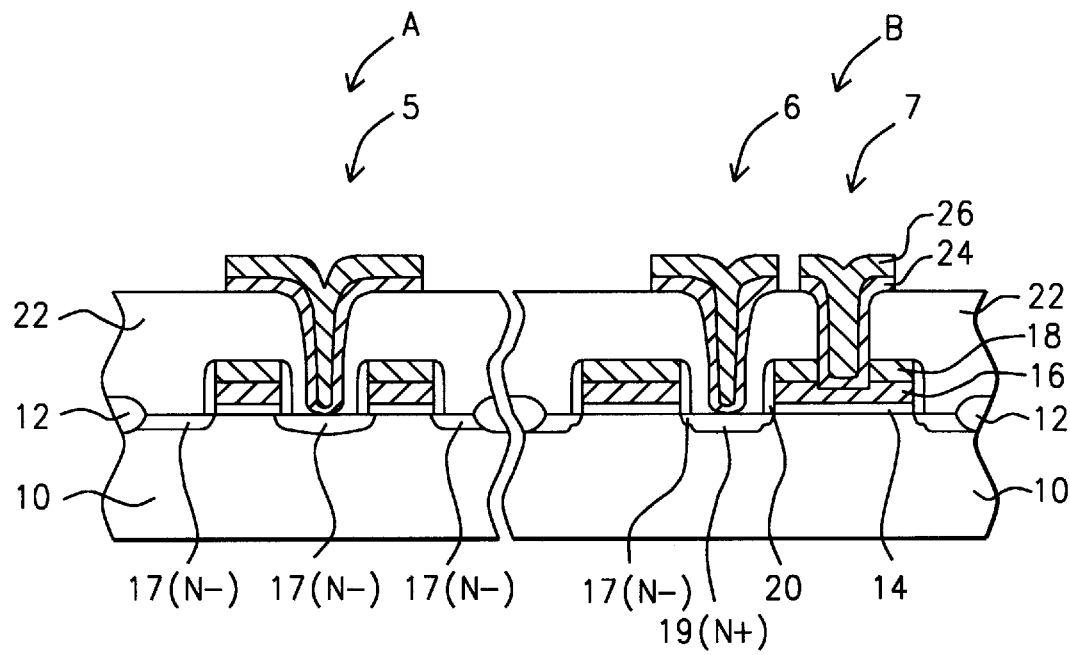
FIG. 2 – Prior Art

METHOD OF MAKING LOCAL INTERCONNECTIONS FOR DYNAMIC RANDOM ACCESS MEMORY (DRAM) CIRCUITS WITH REDUCED CONTACT RESISTANCE AND REDUCED MASK SET

BACKGROUND OF THE INVENTION (1) Field of the Invention

The present invention relates to a process for making local interconnections for DRAM circuits with low contact resistance. The process also reduces the number of masks by one, over the prior art, to provide a more cost-effective manufacturing process.

(2) Description of the Prior Art

Advances in high-resolution photolithography and anisotropic plasma etching have reduced the minimum feature sizes of semiconductor devices. For example, the current minimum feature size of the gate electrodes for field effect transistor (FET) semiconductor devices is sub-half-micrometer (um) (about 0.35 um or less). These discrete devices are electrically interconnected by multilevels of conducting layers with intervening insulating layers having contact openings. The reduced feature sizes require smaller contact openings for the electrically conducting interconnections that lead to higher contact resistance ($R_c$). For example, current contact hole feature sizes are now typically much less than 0.5 micrometer (um), and to make contacts to the FET gate electrodes and for local interconnections, the contacts can be less than 0.35 um in width or diameter. The high $R_c$ is further complicated by the native oxide that forms between the conducting layers in the contact openings during processing. The increase in this parasitic contact resistance in series with circuit devices, such as FETs, degrades the circuit performance and therefore is undesirable. A further concern is the wide distribution in contact resistance ($R_c$) that can occur over the large number of contact holes that are simultaneously etched, and is also very undesirable.

It is common practice in the semiconductor industry to interconnect the semiconductor devices by using multilayers of polycide formed from an electrical conductively doped polysilicon layer and a top silicide layer, and by patterned metal layers to complete the electrical connections on integrated circuits. Because of electrical device characteristics and temperature considerations, it is desirable to form the gate electrodes for FETs and the next level of electrical interconnections (local interconnections) from a patterned first and second level of polycide layers. An InterLevel Dielectric (ILD) layer, such as a silicon oxide ($SiO_2$) is used between the patterned polycide layers to electrically insulate the various levels of patterned polycide layers. Contact holes are etched in the ILD layer to electrically interconnect the first and second polycide layers. On Ultra Large Scale Integration (ULSI), the number of contacts now well exceeds a million, and it is important to have consistently low and tight distributions of the contact resistance ($R_c$).

This high contact resistance problem is of particular concern on DRAM chips between the two patterned tungsten polycide (silicide ($WSi_x$)/polysilicon) layers used to form the FET gate electrodes and the local interconnections on the peripheral circuits of the DRAM chip, while concurrently forming the bit lines from the second polycide layer in the DRAM cell areas.

Unfortunately, when the contact holes are etched in the dielectric layer to the first polycide layer, and when the second polycide layer is deposited, it is difficult to achieve consistently low contact resistance. This high contact resistance results from the native oxide that rapidly forms on the $WSi_x$ of the first polycide layer in the contact openings prior to depositing the second polycide layer. For example, contacts having minimum feature sizes of 0.5 um or less can have contact resistance that exceeds 193 Kohms, which are essentially electrical opens.

One prior art method of reducing the contact resistance between the polycide layers in the peripheral circuits on a DRAM chip is depicted in FIGS. 1 and 2. As shown in FIG. 1, the sequence of process steps for making these low contact resistance interconnections involves providing a substrate 10, forming a field oxide (FOX) 12 to isolate the memory cell device areas as shown in portion A of FIG. 1, and for the peripheral circuit device areas as shown in portion B of FIG. 1. Next, a gate oxide 14 is formed on all the device areas. Then a doped first polysilicon layer 16 and a first silicide layer 18 are deposited and patterned to form a first polycide layer (16 and 18) for the FETs on the substrate 10 for the DRAM pass transistors, and word lines (portion A), while concurrently forming the FETs and parts of the local interconnections in the peripheral area (portion B). Lightly doped source/drain areas 17($N^-$) for the FETs are then formed by implanting a dopant, and a conformal insulating layer is deposited and anisotropically etched back to form insulating sidewall spacers 20 on the FET gate electrodes. Next, a second ion implantation is used to complete the source/drain contact areas 19($N^+$). An Inter-Level Dielectric (ILD) layer 22 is deposited and planarized to insulate the underlying devices (FETs). Contact openings 2 are etched in the ILD layer 22 for the bit lines in the memory cell areas (portion A), and contact openings 3 and 4 are etched in the ILD layer to the substrate and to the first polycide layer, respectively, at the DRAM chip edge (portion B, FIG. 1) for the peripheral circuits. However, to minimize contact resistance, as shown in FIG. 1, the traditional approach is to use an additional photoresist mask (not shown) and an additional etching step to remove the first silicide layer 18 in the contact openings 4 to reduce the contact resistance that would otherwise result from the rapid oxidation of the $WSi_x$ prior to depositing the second polycide layer.

Now as shown in FIG. 2, the bit lines and the local interconnections are completed by depositing an electrically conducting doped second polysilicon layer 24 and a second $WSi_x$ layer 26 to form the second polycide layer. The second polycide layer (24 and 26) is then patterned to form the bit lines 5 in the memory cell area (portion A) and the local interconnections 6 and 7 in the peripheral device area (portion B).

Numerous methods have been reported for making integrated circuits with reduced contact resistance. In U.S. Pat. No. 5,744,395 by Shue et al. a method for making low resistance self-aligned titanium silicide structures for FET gate electrodes is described. A metastable phase of titanium silicide is deposited by CVD and a titanium layer is deposited and a rapid thermal anneal (RTA) is used to convert the silicide to a stable, low resistance silicide. In U.S. Pat. No. 5,759,882 to Kao et al., a method for making self-aligned contacts and local interconnections in CMOS circuits using Chemical Mechanical Polishing (CMP) is described. The method employs two RTA steps: a first RTA to activate the $N^+$ dopant in the diffused devices, and a second RTA to form the conventional salicide process. Cheng et al., U.S. Pat. No. 5,728,615, teach a method of making polysilicon resistors with more uniform resistance. The method employs a thermal step to more uniformly distribute and equalize the hydrogen in the polysilicon resistor. U.S. Pat. No. 5,710,454 to Wu describes a method for making a tungsten silicide gate electrode using a stacked amorphous silicon (SAS) multilayer structure. The method incorporates conductive plugs, such as tungsten, to contact the FET source/drain and gate electrode. Also in U.S. Pat. No. 5,710,078 to Tseng, a method is described for making improved metal bit lines to underlying polycide structures. The method overetches the contact opening in the insulator to the underlying patterned silicide layer to expose the edges and thereby increase contact area and reduce the contact resistance. None of the above cited references addresses the problem of reducing the high contact resistance $R_c$ resulting from the unwanted native oxide at a polycide/polycide interface while concurrently making bit lines on a DRAM chip.

Therefore, there is still a need in the semiconductor industry to reduce the contact resistance between tungsten polycide layers, while reducing the number of processing steps on DRAM chips.

SUMMARY OF THE INVENTION

It is an object of this invention to make local interconnections on DRAM circuits using patterned first and second polycide layers wherein the contact resistance ($R_c$) between the patterned polycide layers is reduced to improve circuit performance.

Another object of this invention is to provide the above process using one fewer masking step than the prior art to reduce manufacturing cost.

In accordance with the above objectives, a method is provided for making electrical contacts with reduced contact resistance ($R_c$) between patterned polycide layers, while reducing the number of masks over the prior art. The method is generally applicable for making electrical interconnections on integrated circuits, and is particularly useful for making low-resistance contacts between patterned first and second polycide layers for circuits on the peripheral device areas of a DRAM chip, while concurrently forming the bit lines for the memory cell areas on the DRAM chip. The method begins by providing a semiconductor substrate, such as a single-crystal silicon wafer. Typically, field effect transistors (FETs) are made in device areas that are isolated from each other by field oxide (FOX) isolation regions. A thin gate oxide is grown on all the device areas. A first polycide layer is formed by depositing a first polysilicon layer that is $N^+$ doped, for example with arsenic (As) or phosphorus (P), making it electrically conducting, and then depositing a first silicide layer composed of tungsten silicide on the first polysilicon layer that further improves the electrical conductivity. A photoresist mask and anisotropic plasma etching are then used to pattern the first polycide (polysilicon/silicide) layer to form a gate electrode in each of the memory cell device areas and concurrently to form the gate electrodes in the peripheral device areas. The patterned first polycide layer also serves to form portions of the local interconnections over the field oxide areas.

After forming the gate electrodes, source/drain areas are formed adjacent to the gate electrodes by ion implantation. For short-channel FETs the source/drain areas can also include lightly doped source/drain regions to minimize short-channel effects.

After completing the FETs, and continuing with the invention, an interlevel dielectric (ILD) layer is deposited over the patterned first polycide layer to insulate the first polycide layer from the next level of interconnections. Contact holes for bit line contacts are etched in the interlevel dielectric layer to one of the source/drain areas in each of the memory cell device areas, while concurrently the contact holes are etched in the ILD layer over the peripheral device areas to the substrate and to the patterned first polycide layer for local interconnections. In the prior art, an additional photoresist mask and etching are used to remove the first silicide layer in the contact openings to the first polysilicon layer in the peripheral device areas to reduce the contact resistance ($R_c$) before depositing and patterning a second polycide layer to complete the local interconnections.

However, by the method of this invention, the additional photoresist masking and etching used in the prior art are not required.

Continuing with this invention, a second polycide layer is deposited and patterned to form bit lines over the memory cell device areas while completing the local interconnections in the peripheral device areas. A rapid thermal anneal (RTA) is carried out to significantly reduce the $R_c$ without requiring an additional masking and etching step, as in the prior art. The RTA is performed at a relatively high temperature for a relatively short time to provide a low thermal budget, and therefore does not significantly affect the diffusion profiles in the semiconductor devices.

By including an additional nitrogen ($N_2$) treatment (anneal) of the first polycide layer in the contact openings prior to depositing and patterning the second polycide layer, as is practiced in the industry, the RTA of this invention in conjunction with the $N_2$ anneal results in a synergistic effect that further reduces the contact resistance ($R_c$).

BRIEF DESCRIPTION OF THE DRAWINGS

The objects and other advantages of this invention are best understood with reference to the preferred embodiment when read in conjunction with the drawings that follow.

FIGS. 1 and 2 are prior-art schematic cross-sectional views for making local interconnections on DRAM circuits using a photoresist mask and etching to reduce contact resistance ($R_c$).

DESCRIPTION OF THE PREFERRED EMBODIMENT

Figure 3:
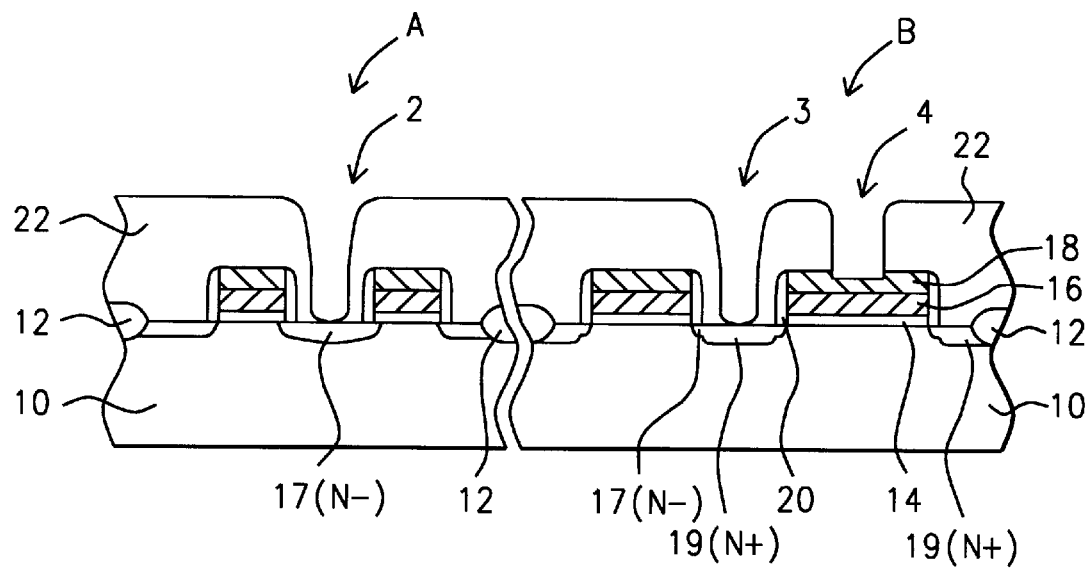
FIGS. 3 and 4 are schematic cross-sectional views for making local interconnections on DRAM circuits by the method of the current invention that avoids the additional photoresist masking and etching step of the prior art, and includes a rapid thermal anneal to reduce $R_c$.
Figure 4:
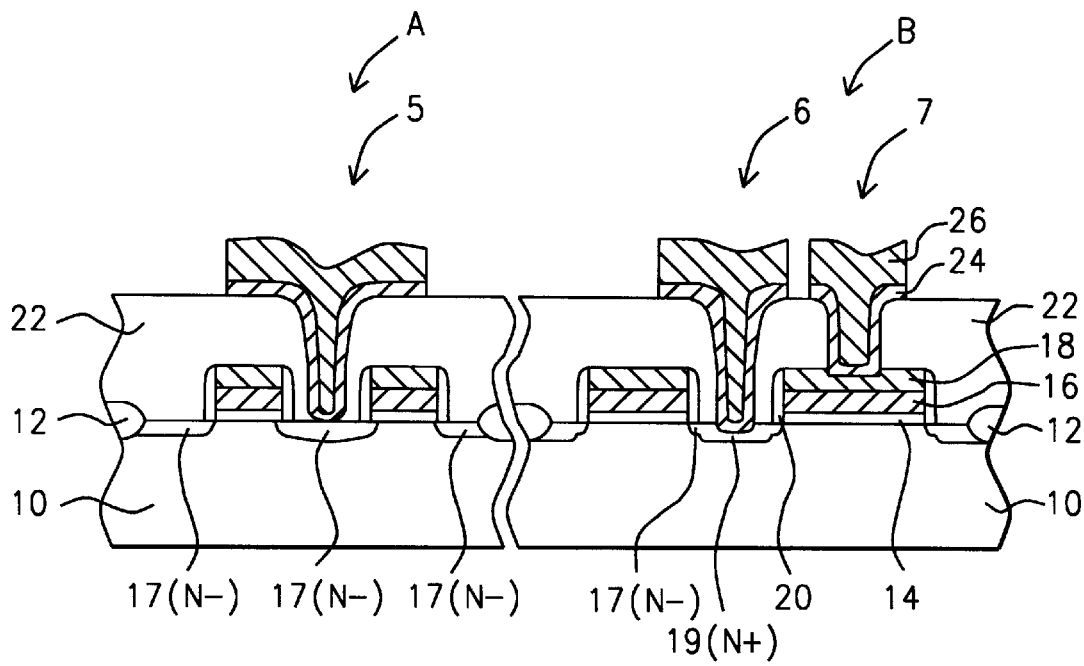

Referring now to FIGS. 3 and 4, an embodiment of the invention is described for making contacts having low resistance through contact holes in a dielectric layer between two patterned polycide layers. The method is specifically applicable for forming the word lines and bit lines on memory cells for DRAM circuits, while concurrently forming the local interconnections on the periphery of the DRAM chip with low contact resistance. The circuits in the peripheral device areas are used to access the memory cells for writing (storing) and reading (retrieving) binary data.

Referring to FIG. 3, the series of steps used to form the contacts having this low contact resistance begins by providing a semiconductor substrate 10. Only two portions of the DRAM chip are depicted in FIG. 3. The portion A in FIG. 3 depicts one of the memory cell area, while the portion B depicts a segment of the peripheral area on the DRAM chip. The preferred substrate 10 is composed of a single-crystal silicon having a <100> crystallographic orientation. Typically for DRAM circuits the substrate is doped with a P type conductive dopant, and the FETs in the memory cell areas A are N channel FETs. Alternatively the substrate can have P-well and N-well regions in the peripheral area B for forming CMOS-type integrated circuits. However, to simplify the discussion, only a P$^-$ substrate is shown in FIG. 3 for providing N-channel FETs for pass transistors on an array of DRAM cells, while only the N-channel FETs are depicted in the peripheral area.

Still referring to FIG. 3, field oxide (FOX) regions 12 are formed to electrically isolate the device areas. Typically the FOX regions 12 are formed by the LOCal Oxidation of Silicon (LOCOS) method as is commonly practiced in the industry, and is formed to a thickness of between about 2000 and 4000 Angstroms. Alternatively, other methods, such as Shallow Trench Isolation (STI), can be used to form the FOX 12 to improve circuit density, but for the purpose of this invention the LOCOS structure is depicted in the Figs.

Still referring to FIG. 3, the FETs are formed by first growing a thin gate oxide layer 14. The gate oxide 14 is typically formed by thermal oxidation on the device areas and is grown to a thickness of between about 60 and 120 Angstroms. Next, a first polysilicon layer 16 is deposited on the substrate 10 and over the gate oxide 14. The preferred thickness of the first polysilicon layer is between about 1000 and 1500 Angstroms. The polysilicon layer 16 is deposited, for example, by low-pressure chemical vapor deposition (LPCVD) using, for example, silane (SiH$_4$) as the reactant gas. The polysilicon layer 16 is then doped by ion implantation using phosphorus (p$^{31}$) or arsenic (As$^{75}$) ions. Preferably the dopant concentration after implanting is between about 1.0 E 19 and 1.0 E 21 atoms/cm$^3$. Alternatively the polysilicon layer 16 can be doped in situ with phosphine (PH$_3$) to a concentration of between about 2.0 E 20 and 5.0 E 20 atoms/cm$^3$.

Continuing with FIG. 3, a first silicide layer 18 is then deposited on the first polysilicon layer 16 to form the first polycide layer (layers 16 and 18) and to increase electrical conductivity. Preferably the first silicide layer 18 is composed of a tungsten silicide (WSi$_x$) and has a thickness of about 1000 to 1500 Angstroms. One preferred method for forming the silicide layer 18 is by chemical vapor deposition (CVD) using, for example, tungsten hexafluoride (WF$_6$) and SiH$_4$. Alternatively, a thicker first polysilicon layer 16 can be deposited, and a tungsten metal can be deposited and annealed to form the first polycide layer.

Conventional photolithographic techniques and anisotropic plasma etching are now used to pattern the first polycide layer (first polysilicon layer 16 and the first silicide layer 18) to form gate electrodes over the memory cell device areas in portion A of FIG. 3, and to form gate electrodes (16 and 18) and portions of the local interconnections (16 and 18) in the peripheral areas (portion B) of FIG. 3. The anisotropic etching can be carried out, for example, in a high-density plasma (HDP) etcher or reactive ion etcher (RIE) using an etchant gas mixture such as boron trichloride and chlorine (BCl$_3$/C$_2$) or hydrogen bromide, chlorine, and oxygen (HBr/Cl$_2$/O$_2$).

After forming the gate electrodes (16 and 18), lightly doped source/drain areas 17(N$^-$) are formed adjacent to the gate electrodes by ion implantation. For N-channel FETs commonly used for DRAM cells, the implant dopant is typically arsenic (As$^{75}$) or phosphorus (P$^{31}$) ions, and is implanted to give a final dopant concentration of between about 1.0 E 13 and 5.0 E 13 atoms/cm$^3$ for P$^{31}$, and to a concentration of between about 1.0 E 15 and 5.0 E 15 atoms/cm$^3$ for As$^{75}$. Next, a conformal insulating layer 20, such as SiO$_2$ or Si$_3$N$_4$, is deposited and etched back to form sidewall spacers 20. For example, the SiO$_2$ can be deposited by LPCVD using tetraethosiloxane (TEOS) as the reactant gas.

After completing the FETs, and continuing with the invention, an interlevel dielectric (ILD) layer 22 is deposited over the patterned first polycide layer (layers 16 and 18) to insulate the first polycide layer from the next level of interconnections. The ILD layer 22 is preferably composed of a SiO$_2$ or borophosphosilicate glass (BPSG). The SiO$_2$ is deposited by LPCVD using a reactant gas such as TEOS or TEOS/ozone (O$_3$). The BPSG can be formed by adding boron and phosphorus dopant gases during the SiO$_2$ LPCVD. The ILD layer 22 is then planarized, for example, by chemical-mechanical polishing (CMP) back to have a final thickness over the patterned polycide layer (16 and 18) of between about 6000 and 8000 Angstroms.

Still referring to FIG. 3, conventional photolithographic techniques and anisotropic plasma etching are used to etch contact holes 2 for bit line contacts in the ILD layer 22 to one of the source/drain areas 17(N$^-$) in each of the memory cell device areas, while concurrently contact holes 3 are etched in the ILD layer to the source/drain 19(N$^+$) in the peripheral device areas to the substrate 10 and contact openings 4 are etched to the patterned first polycide layer (16 and 18) for local interconnections. In the prior art, as shown in FIG. 1, an additional photoresist mask and etching are used to selectively remove the WSi$_x$ layer 18, which has a native oxide that quickly forms on the silicide surface that would otherwise cause high contact resistance (R$_c$) between polycide layers in the contact openings 4. However, by the method of this invention, this additional photoresist masking and etching used in the prior art are not required.

Continuing with this invention and as shown in FIG. 4, a second polycide layer, composed of an N$^+$ doped polysilicon layer 24 and a WSi$_x$ layer 26, is deposited and patterned to form bit lines 5 in the memory cell device areas, while completing the local interconnections 6 to the substrate 10 and local interconnections 7 to the first polycide layer (16 and 18) in the peripheral device areas (portion B). The second polysilicon layer 24 is deposited by LPCVD using silane (SiH$_4$) as the reactant gas, and is in-situ doped with phosphine (PH$_3$) to a concentration of between about 2.0 E 20 and 5.0 E 20 atoms/cm$^3$. The polysilicon layer 24 is deposited to a preferred thickness of between about 500 and 1000 Angstroms. The second WSi$_x$ layer 26 is deposited to a thickness of 1000 to 1500 Angstroms. The second WSi$_x$ layer 26 can also be deposited by LPCVD using tungsten hexafluoride (WF$_6$) and SiH$_4$ as the reactant gases. Next, the second polycide layer (24 and 26) is patterned using conventional photolithographic techniques and anisotropic plasma etching to complete the local interconnections. For example, the etching can be carried out in a high-density plasma (HDP) etcher or reactive ion etcher using an etchant gas mixture such as boron trichloride and chlorine (BCl$_3$/Cl$_2$) or hydrogen bromide, chlorine, and oxygen (HBr/Cl$_2$/O$_2$).

After completing the local interconnections, a key feature of this invention is to carry out a rapid thermal anneal (RTA) to significantly reduce the R$_c$ without requiring an additional masking and etching step, as in the prior art. The RTA is performed at a relatively high temperature for a relatively short time to provide a low thermal budget, and therefore does not significantly affect the diffusion profiles in the semiconductor devices. More specifically, the RTA is carried out in a nitrogen ambient environment at a temperature of between about 950 and 1050° C. for a time of about 10 to 20 seconds. The RTA can be carried out in an annealing tool, such as Model RTP XE Centura, manufactured by Applied Materials, Inc. of U.S.A.

To better appreciate the advantages of this invention, when the RTA is not carried out, the contact resistance $R_c$ is about 193 Kohms and are essentially electrical opens. After the RTA of this invention, the $R_c$ is reduced to only 839 ohms. Further, by including an additional nitrogen ($N_2$) treatment, such as annealing in $N_2$, of the first polycide layer (16 and 18) in the contact openings 7 prior to depositing and patterning the second polycide layer (24 and 26), as is practiced in the industry, the RTA of this invention in conjunction with this $N_2$ anneal results in a synergistic effect that further reduces the contact resistance $R_c$ to only about 362 ohms. However, if the $N_2$ treatment is carried out by itself, without the RTA of this invention, the contact resistance $R_c$ is 21 Kohms, which is substantially higher. Although not depicted in the figures, the DRAM integrated circuit can now be completed by forming the capacitor over bit lines (COB) structures and additional levels of patterned metal for global interconnections to complete the electrical wiring on the chip.

While the invention has been particularly shown and described with reference to the preferred embodiment thereof, it will be understood by those skilled in the art that various changes in form and details may be made without departing from the spirit and scope of the invention.

What is claimed is:

1. A method for making local interconnections for dynamic random access memory (DRAM) circuits on a DRAM chip on a semiconductor substrate comprising the steps of:

providing said semiconductor substrate having memory cell device areas and peripheral device areas on said DRAM chip, said device areas surrounded and electrically isolated by field oxide isolation;

forming a gate oxide on said device areas;

depositing a first polycide layer on said substrate;

patterning said first polycide layer to form gate electrodes for field effect transistors (FETs) in said device areas and to form portions of said local interconnections over said field oxide isolation;

forming source/drain contact areas adjacent to said gate electrodes;

depositing an interlevel dielectric layer on said substrate;

etching contact openings for bit lines in said interlevel dielectric layer to said source/drain contact areas in said memory cell device areas, and concurrently etching contact openings to said source/drain contact areas in said peripheral device areas, while etching contact openings to said patterned first polycide layer in said peripheral device areas;

depositing a second polycide layer over said interlevel dielectric layer and in said contact openings;

patterning said second polycide layer to form bit lines over said contact openings in said memory cell device areas, and concurrently forming said local interconnections over and in said contact openings in said peripheral device areas;

performing a rapid thermal anneal to reduce the contact resistance between said patterned first polycide layer and said patterned second polycide layer in said contact openings to said patterned first polycide layer and thereby completing said local interconnections for DRAM circuits.

2. The method of claim 1, wherein said first polycide layer is formed by depositing a first polysilicon layer to a thickness of between about 1000 and 1500 Angstroms, and by depositing on said first polysilicon layer a first tungsten silicide layer to a thickness of between about 1000 and 1500 Angstroms.

3. The method of claim 2, wherein said first polysilicon layer is doped with a conductive type dopant to a concentration of between 1.0 E 19 and 1.0 E 21 atoms/cm$^3$.

4. The method of claim 1, wherein said source/drain contact areas in said memory cell device areas are doped by ion implantation with N$^-$ dopants to a concentration of between about 1.0 E 13 and 5.0 E 13 atoms/cm$^3$ with phosphorus, and to a concentration of between about 1.0 E 15 and 5.0 E 15 atoms/cm$^3$ with arsenic.

5. The method of claim 1, wherein said source/drain contact areas in said peripheral device areas are doped by ion implantation with an N$^+$ dopant to a concentration of between about 1.0 E 19 and 1.0 E 21 atoms/cm$^3$.

6. The method of claim 1, wherein said interlevel dielectric layer is silicon oxide, deposited by chemical vapor deposition, to a thickness of between about 6000 and 10000 Angstroms.

7. The method of claim 1, wherein said second polycide layer is formed by depositing a second polysilicon layer to a thickness of between about 500 and 1000 Angstroms, and by depositing on said second polysilicon layer a second tungsten silicide layer to a thickness of between about 1000 and 1500 Angstroms.

8. The method of claim 7, wherein said second polysilicon layer is in-situ doped with a conductive type dopant to a concentration of between 2.0 E 20 and 5.0 E 20 atoms/cm$^3$.

9. The method of claim 1, wherein said rapid thermal anneal is carried out in a nitrogen ambient at a temperature of between about 950 and 1050° C. for a time of between about 10 and 20 seconds.

10. The method of claim 1, wherein said first polycide layer exposed in said contact openings is subjected to a nitrogen treatment prior to depositing said second polycide layer.

11. A method for making local interconnections for dynamic random access memory (DRAM) circuits on a DRAM chip on a semiconductor substrate comprising the steps of:

providing said semiconductor substrate having memory cell device areas and peripheral device areas on said DRAM chip, said device areas surrounded and electrically isolated by field oxide isolation;

forming a gate oxide on said device areas;

depositing a first polycide layer on said substrate;

patterning said first polycide layer to form gate electrodes for field effect transistors (FETs) in said device areas and to form portions of said local interconnections over said field oxide isolation;

forming source/drain contact areas adjacent to said gate electrodes;

depositing an interlevel dielectric layer on said substrate;

etching contact openings for bit lines in said interlevel dielectric layer to said source/drain contact areas in said memory cell device areas, and concurrently etching contact openings to said source/drain contact areas in said peripheral device areas, while etching contact openings to said patterned first polycide layer in said peripheral device areas;

subjecting to a nitrogen treatment said first polycide layer in said contact openings;

depositing a second polycide layer over said interlevel dielectric layer and in said contact openings;

patterning said second polycide layer to form bit lines over said contact openings in said memory cell device areas, and concurrently forming said local interconnections over and in said contact openings in said peripheral device areas;

performing a rapid thermal anneal to reduce the contact resistance between said patterned first polycide layer and said patterned second polycide layer in said contact openings to said patterned first polycide layer and thereby completing said local interconnections for DRAM circuits.

12. The method of claim 11, wherein said first polycide layer is formed by depositing a first polysilicon layer to a thickness of between about 1000 and 1500 Angstroms, and by depositing on said first polysilicon layer a first tungsten silicide layer to a thickness of between about 1000 and 1500 Angstroms.

13. The method of claim 12, wherein said first polysilicon layer is doped with a conductive type dopant to a concentration of between 1.0 E 19 and 1.0 E 21 atoms/cm$^3$.

14. The method of claim 12, wherein said first polysilicon layer is in-situ doped with phosphorus to a concentration of between 2.0 E 20 and 5.0 E 20 atoms/cm$^3$.

15. The method of claim 11, wherein said source/drain contact areas in said memory cell device areas are doped by ion implantation with N$^-$ dopants to a concentration of between about 1.0 E 13 and 5.0 E 13 atoms/cm$^3$ with phosphorus, and to a concentration of between about 1.0 E 15 and 5.0 E 15 atoms/cm$^3$ with arsenic.

16. The method of claim 11, wherein said source/drain contact areas in said peripheral device areas are doped by ion implantation with an N$^+$ dopant to a concentration of between about 1.0 E 19 and 1.0 E 21 atoms/cm$^3$.

17. The method of claim 11, wherein said interlevel dielectric layer is silicon oxide, deposited by chemical vapor deposition (CVD), to a thickness of between about 6000 and 10000 Angstroms.

18. The method of claim 11, wherein said nitrogen treatment is carried out in a nitrogen box on a polysilicon deposition furnace prior to forming said second polycide layer.

19. The method of claim 11, wherein said second polycide layer is formed by depositing a second polysilicon layer to a thickness of between about 500 and 1000 Angstroms, and by depositing on said second polysilicon layer a second tungsten silicide layer to a thickness of between about 1000 and 1500 Angstroms.

20. The method of claim 19, wherein said second polysilicon layer is doped with a conductive type dopant to a concentration of between 1.0 E 19 and 1.0 E 21 atoms/cm$^3$.

21. The method of claim 11, wherein said rapid thermal anneal is carried out in a nitrogen ambient at a temperature of between about 950 and 1050° C. for a time of between about 10 and 20 seconds.

* * * * *